United States Patent
Kato

(10) Patent No.: US 7,906,038 B2
(45) Date of Patent: Mar. 15, 2011

(54) AQUEOUS POLISHING LIQUID AND CHEMICAL MECHANICAL POLISHING METHOD

(75) Inventor: Tomo Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1206 days.

(21) Appl. No.: 11/525,864

(22) Filed: Sep. 25, 2006

(65) Prior Publication Data

US 2007/0069176 A1    Mar. 29, 2007

(30) Foreign Application Priority Data

Sep. 26, 2005  (JP) ................................ 2005-278336

(51) Int. Cl.
*C09K 13/00*    (2006.01)
(52) U.S. Cl. .......... 252/79.1; 252/79.2; 438/692; 216/89
(58) Field of Classification Search ................. 252/79.1, 252/79.2; 438/691, 692; 216/88, 89
See application file for complete search history.

(56) References Cited

U.S. PATENT DOCUMENTS

| | | | |
|---|---|---|---|
| 4,944,836 A | | 7/1990 | Beyer et al. |
| 2004/0108302 A1* | | 6/2004 | Liu et al. ......................... 216/83 |
| 2005/0056810 A1* | | 3/2005 | Bian et al. .................... 252/79.1 |
| 2005/0136670 A1* | | 6/2005 | Ameen et al. ................. 438/691 |

FOREIGN PATENT DOCUMENTS

| | | |
|---|---|---|
| JP | 49-122432 A | 11/1974 |
| JP | 2-278822 A | 11/1990 |
| JP | 2001-127019 A | 5/2001 |

OTHER PUBLICATIONS

F. B. Kaufman et al., "Chemical-Mechanical Polishing for Fabricating Patterned W Metal Features as Chip Interconnects" (1991) J. Electrochem. Soc., vol. 138, No. 11, pp. 3460-3465.
Seiichi Kondo et al., "Abrasive-Free Polishing for Copper Damascene Interconnection" (2000) Journal of the Electrochemical Society, vol. 147, No. 10, pp. 3907-3913.

* cited by examiner

*Primary Examiner* — Lan Vinh
(74) *Attorney, Agent, or Firm* — Sughrue Mion, PLLC

(57) ABSTRACT

An aqueous polishing liquid is provided that includes an oxidizing agent, a five-membered monocyclic compound having at least three nitrogen atoms or a compound in which a hetero ring is fused to said compound, and a compound having an imidazole skeleton or an isothiazolin-3-one skeleton. The five-membered monocyclic compound having at least three nitrogen atoms and/or the compound in which a hetero ring is fused to said compound is used at a total concentration of less than 300 mg/L, and the compound having an imidazole skeleton or an isothiazolin-3-one skeleton is used at a concentration of at least 10 mg/L but no greater than 500 mg/L. There is also provided a chemical mechanical polishing method that includes a step of polishing by making a surface to be polished and a polishing surface move relative to each other while being in contact with each other in the presence of the aqueous polishing liquid.

13 Claims, 1 Drawing Sheet

AQUEOUS POLISHING LIQUID AND CHEMICAL MECHANICAL POLISHING METHOD

BACKGROUND OF THE INVENTION

1. Field of the Invention

The present invention relates to production of a semiconductor device and, in particular, to an aqueous polishing liquid in a wiring step for a semiconductor device and a chemical mechanical polishing method employing same.

2. Description of the Related Art

With regard to the development of semiconductor devices represented by large-scale integrated circuits (hereinafter, denoted by 'LSI'), in order to achieve small dimensions and high speed there has in recent years been a demand for higher density and higher integration by increasing the fineness and the layering of wiring. As techniques therefor, various techniques such as chemical mechanical polishing (hereinafter, denoted by 'CMP') have been employed. CMP is an essential technique for carrying out surface planarization of a film that is to be processed such as an interlayer insulating film, plug formation, formation of embedded metal wiring, etc., and carries out removal of a surplus metal thin film during the planarization of a substrate or the formation of wiring. This technique is disclosed in, for example, U.S. Pat. No. 4,944,836.

A general CMP method involves affixing a polishing pad to a circular polishing platen, soaking the surface of the polishing pad with a polishing liquid, pressing the surface of a substrate (wafer) against the pad, and rotating both the polishing platen and the substrate while applying a predetermined pressure (polishing pressure) to the reverse sides thereof, thus planarizing the surface of the substrate by means of the mechanical friction generated.

The polishing liquid used in CMP generally comprises abrasive grains (e.g. alumina, silica) and an oxidizing agent (e.g. hydrogen peroxide, persulfuric acid). It is surmised that the basic mechanism involves oxidizing the metal surface by the oxidizing agent and polishing by removing the oxidized film by means of the abrasive grains, and it is described in, for example, Journal of Electrochemical Society, 1991, Vol. 138, No. 11, p. 3460 to p. 3464.

However, when CMP is carried out using a polishing liquid comprising such solid abrasive grains, abrasive damage (scratching), a phenomenon in which the entire surface to be polished is abraded more than necessary (thinning), a phenomenon in which the metal surface to be polished bends in a dish shape (dishing), a phenomenon in which an insulator between metal wires is abraded more than necessary and a plurality of metal wiring surfaces bend in a dish shape (erosion), etc. might occur.

Furthermore, in a washing step, which is normally carried out after polishing in order to remove polishing liquid remaining on the semiconductor surface, due to the use of the polishing liquid comprising the solid abrasive grains the washing step becomes complicated, and when disposing of the liquid after washing (liquid waste) it is necessary to separate the solid abrasive grains by sedimentation, which causes a problem in terms of cost.

As means for solving these problems, for example, a metal surface polishing method involving combination of dry etching and a polishing liquid containing no abrasive grains is disclosed in Journal of Electrochemical Society, 2000, Vol. 147, No. 10, p. 3907 to p. 3913, and a polishing liquid comprising hydrogen peroxide/malic acid/benzotriazole/ammonium polyacrylate and water is disclosed in JP-A-2001-127019 (JP-A denotes a Japanese unexamined patent application publication). In accordance with these methods, a metal film on a projecting portion of a semiconductor substrate is selectively subjected to CMP, the metal film in a recessed portion remains, and a desired conductor pattern is thus obtained. Since CMP proceeds due to friction with a polishing pad that is mechanically much softer than the conventional solid abrasive grains, the occurrence of scratches is suppressed. However, there is the defect that, due to a decrease in the physical polishing force, a sufficient polishing rate cannot be obtained.

On the other hand, as metals for wiring, tungsten and aluminum have been commonly used in an interconnect structure. However, with the aim of achieving higher performance, an LSI employing copper, which has a lower wiring resistance than that of the above metals, has been developed. As a method for wiring with copper, a damascene method is known from, for example, JP-A-2-278822. Furthermore, a dual damascene method in which a contact hole and a wiring trench are simultaneously formed in an interlayer insulating film, and a metal is embedded in the two has been widely used. As a target material for copper wiring, a copper target having a high purity of five nines or greater has been shipped. However, due to a recent increase in the fineness of wiring for the purpose of achieving higher density, it is necessary to improve the conductivity and electronic characteristics of copper wiring, and accompanying the above, the use of a copper alloy formed by adding a third component to high purity copper has been examined. At the same time, there is a desire for high speed metal polishing means that enables high productivity to be exhibited without contaminating these high definition, high purity materials. When polishing copper metal, since it is a particularly soft metal, the above-mentioned dishing, erosion, or scratching easily occurs, and a polishing technique with higher precision has been desired.

Moreover, in order to improve the productivity, the diameter of a wafer when producing an LSI has been increasing in recent years; currently, one with a diameter of 200 mm or greater is commonly used, and production employing one with a diameter of 300 mm or greater has also started. Accompanying this increase in wafer dimensions, a difference in polishing rate between the central area and the peripheral area of the wafer easily occurs, and there is an increasing desire for the polishing in the plane of the wafer to be uniform.

As a chemical polishing method employing no mechanical polishing means for copper and a copper alloy, a method described in JP-A-49-122432 is known. However, a chemical polishing method employing only a chemical dissolution action still has a serious problem with the planarity since, compared with CMP, in which a metal film on a projection is selectively polished chemically and mechanically, a recess is scraped out, that is, dishing, etc. occurs.

Furthermore, in order to prevent copper ions from diffusing into an insulating material when copper wiring is employees, a diffusion-preventing layer, which is called a barrier layer, is generally provided between a wiring section and an insulating layer, as a single layer or two or more layers selected from TaN, TaSiN, Ta, TiN, Ti, Nb, W, WN, Co, Zr, ZrN, and a CuTa alloy. However, since these barrier materials themselves have conductive properties, it is necessary to completely remove the barrier material on the insulating layer in order to prevent the occurrence of errors such as leakage current, and this removal process is carried out by a method similar to bulk polishing of a metal wiring material (barrier CMP). When carrying out bulk polishing of copper, since dishing easily occurs particularly in a wide metal wiring section, in order to achieve final planarization it is desirable that the amount removed by polishing can be adjusted between the wiring section and the barrier section. Because of this, it is desirable that a polishing liquid for barrier polishing has an optimum polishing selectivity between copper and the barrier metal. Moreover, since the wiring pitch and the wiring density are different in each wiring layer level, it is more desirable that the above-mentioned polishing selectivity can be appropriately adjusted.

BRIEF SUMMARY OF THE INVENTION

The present invention has been accomplished under the above-mentioned circumstances that, in order to improve the productivity and degree of integration of an IC chip or an LSI, there is a desire for increasing the polishing rate of the CMP and, in particular, the polishing rate of wiring employing copper metal and a copper alloy as starting materials.

It is therefore an object of the present invention to provide an aqueous polishing liquid that has a high CMP rate and that causes little dishing when fabricating a semiconductor device such as an IC chip or an LSI, and a chemical mechanical polishing method employing the aqueous polishing liquid.

As a result of an intensive investigation by the present inventors into the problems of the above-mentioned polishing liquid, it has been found that the problems can be solved by use of the aqueous polishing liquid below, and the object has thus been attained.

That is, the present invention is as described in (1) and (5) below. (2) to (4), which are preferred embodiments, are also shown below.
(1) An aqueous polishing liquid comprising an oxidizing agent, a five-membered monocyclic compound having at least three nitrogen atoms or a compound in which a hetero ring is fused to said compound, and a compound having an imidazole skeleton or an isothiazolin-3-one skeleton,
(2) the aqueous polishing liquid according (1) above, wherein it comprises a chelating agent,
(3) the aqueous polishing liquid according (1) or (2) above, wherein the five-membered monocyclic compound having at least three nitrogen atoms and/or the compound in which a hetero ring is fused to said compound is used at a total concentration of less than 300 mg/L, and the compound having an imidazole skeleton or an isothiazolin-3-one skeleton is used at a concentration of at least 10 mg/L but no greater than 500 mg/L,
(4) the aqueous polishing liquid according to any one of (1) to (3) above, wherein the compound having an imidazole skeleton or an isothiazolin-3-one skeleton is a compound containing no halogen atom,
(5) a chemical mechanical polishing method comprising a step of polishing by making a surface to be polished and a polishing surface move relative to each other while being in contact with each other in the presence of the aqueous polishing liquid according to any one of (1) to (4) above.

DETAILED DESCRIPTION OF THE INVENTION

Figure 1:
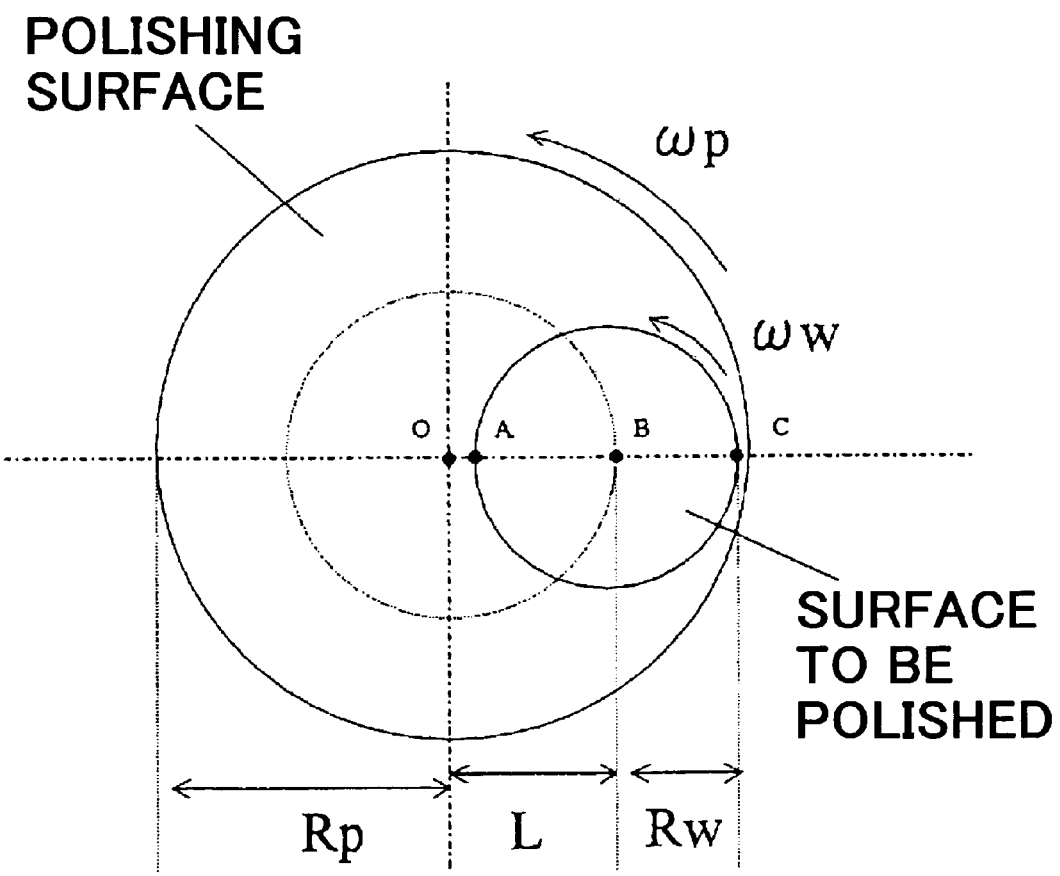
FIG. 1 is a plan view of a rotary polishing surface including a polishing surface and a surface to be polished for explaining average relative speed.

Specific embodiments of the present invention are explained below.

When referring to groups (atomic groups) in the present specification, those that are not specified as being substituted or unsubstituted include those with a substituent and those without substituent. For example, when referring to an 'alkyl group', this includes not only an alkyl group having no substituent (unsubstituted alkyl group) but also an alkyl group having a substituent (substituted alkyl group).

<Aqueous Polishing Liquid>

The aqueous polishing liquid of the present invention (hereinafter, simply called a 'polishing liquid') comprises as constituents at least an oxidizing agent, a five-membered monocyclic compound having at least three nitrogen atoms or a compound in which a hetero ring is fused to the above compound (hereinafter, also called 'Compound A'), and a compound having an imidazole skeleton or an isothiazolin-3-one skeleton (hereinafter, also called 'Compound B').

The polishing liquid of the present invention may comprise other components, and as preferred components a chelating agent, an acid, a surfactant, a water-soluble polymer, and an additive may be cited.

Each component contained in the polishing liquid may be used singly or in a combination of two or more types.

Among components that are added when preparing a concentrate of a polishing liquid, the amount added of one that has a solubility at room temperature in water of less than 5% is preferably no more than 2 times the solubility at room temperature in water, and more preferably no more than 1.5 times, from the viewpoint of prevention of precipitation when the concentrate is cooled to 5° C., etc.

'Concentrated' and 'concentrated liquid' referred to in the present specification are used with the meaning of the common expression, and mean more 'concentrated' and a more 'concentrated liquid' than the state in which it is used, and they are used with a different meaning from the generally used one implying a physical concentration operation such as evaporation.

That is, the concentrated liquid and the concentrated polishing liquid referred to here mean a polishing liquid that is prepared so as to have a higher solute concentration than that of a polishing liquid when it is used for polishing, and they are diluted with water or an aqueous solution, etc. when used for polishing. The dilution ratio is generally 1 to 20 times by volume.

In the present invention, the 'polishing liquid' referred to means not only a polishing liquid when used for polishing (that is, a polishing liquid diluted as necessary) but also a concentrated polishing liquid.

Compound A

The aqueous polishing liquid of the present invention comprises a five-membered monocyclic compound having at least three nitrogen atoms or a compound in which a hetero ring is fused to the above compound (Compound A). Compound A has a function as an etching inhibitor.

Specific examples of Compound A include triazole, tetrazole, and derivatives thereof. Among them, tetrazole and a derivative thereof are preferable.

Among the above-mentioned triazole, tetrazole, and derivatives thereof, compounds represented by Formulae (I) to (III) below are particularly preferable.

Compounds represented by Formula (I) are first explained in detail below.

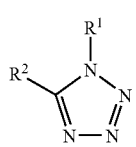
(I)

In Formula (I), $R^1$ and $R^2$ independently denote a hydrogen atom or a monovalent substituent. $R^1$ and $R^2$ may bond to each other to form a ring. When $R^1$ and $R^2$ are simultaneously hydrogen atoms, the compound represented by Formula (I) may be a tautomer.

In Formula (I), the monovalent substituent denoted by $R^1$ and $R^2$ is not particularly limited, and examples thereof include those below, except that, with regard to $R^1$, among the monovalent substituents below a monovalent substituent that cannot give a stable compound when bonded to the nitrogen atom is excluded.

The 'substituent' here include a substituent atom. With regard to examples cited for a group (atomic group) in the present invention, in the case of a substituent that can be substituted, a substituted group is included as well as an unsubstituted group. For example, when referring to an 'alkyl group', this includes not only an unsubstituted alkyl group but also a substituted alkyl group having at least one substituent.

A halogen atom (a fluorine atom, a chlorine atom, a bromine atom, or an iodine atom), an alkyl group (a straight-chain, branched, or cyclic alkyl group, which may be a polycyclic alkyl group such as a bicycloalkyl group or may contain an active methine group), an alkenyl group, an alkynyl group, an aryl group, a heterocyclic group (any substitution position), an acyl group, an alkoxycarbonyl group, an aryloxycarbonyl group, a heterocyclooxycarbonyl group, a carbamoyl group (which may be a carbamoyl group having a substituent, examples thereof including an N-hydroxycarbamoyl group, an N-acylcarbamoyl group, an N-sulfonylcarbamoyl group, an N-carbamoylcarbamoyl group, a thiocarbamoyl group, and an N-sulfamoylcarbamoyl group), a carbazoyl group, a carboxy group or a salt thereof, an oxalyl group, an oxamoyl group, a cyano group, a carbonimidoyl group, a formyl group, a hydroxy group, an alkoxy group (including a group containing repeating ethyleneoxy group units or propyleneoxy group units), an aryloxy group, a heterocyclooxy group, an acyloxy group, an (alkoxy or aryloxy) carbonyloxy group, an (unsubstituted, mono-substituted, or di-substituted) carbamoyloxy group, an (unsubstituted, alkyl, or aryl) sulfonyloxy group, an amino group, an (alkyl, aryl, or heterocyclic) amino group, an acylamino group, a sulfonamide group, a ureido group, a thioureido group, an N-hydroxyureido group, an imide group, an (alkoxy or aryloxy) carbonylamino group, a sulfamoylamino group, a semicarbazide group, a thiosemicarbazide group, a hydrazino group, an ammonio group, an oxamoylamino group, an N-(alkyl or aryl) sulfonylureido group, an N-acylureido group, an N-acylsulfamoylamino group, a hydroxyamino group, a nitro group, a quaternary nitrogen atom-containing heterocyclic group (e.g. pyridinio group, imidazolio group, quinolinio group, or isoquinolinio group), an isocyano group, an imino group, a mercapto group, an (alkyl, aryl, or heterocyclic) thio group, an (alkyl, aryl, or heterocyclic) dithio group, an (alkyl or aryl) sulfonyl group, an (alkyl or aryl) sulfinyl group, a sulfo group or a salt thereof, a sulfamoyl group (the sulfamoyl group may have a substituent, e.g. an N-acylsulfamoyl group, or an N-sulfonylsulfamoyl group) or a salt thereof, a phosphino group, a phosphinyl group, a phosphinyloxy group, a phosphinylamino group, a silyl group, etc. can be cited.

The active methine group referred to here means a methine group that is substituted with two electron-withdrawing groups, and the electron-withdrawing group referred to here means, for example, an acyl group, an alkoxycarbonyl group, an aryloxycarbonyl group, a carbamoyl group, an alkylsulfonyl group, an arylsulfonyl group, a sulfamoyl group, a trifluoromethyl group, a cyano group, a nitro group, or a carbonimidoyl group. The two electron-withdrawing groups may bond to each other to form a ring structure. The salt referred to above means a salt formed with a cation of an alkali metal, an alkaline earth metal, a heavy metal, etc. or an organic cation such as an ammonium ion or a phosphonium ion.

Among them, preferred examples of the monovalent substituent include a halogen atom (a fluorine atom, a chlorine atom, a bromine atom, or an iodine atom), an alkyl group (which may be a straight-chain, branched, or cyclic alkyl group or a polycyclic alkyl group such as a bicycloalkyl group, and may contain an active methine group), an alkenyl group, an alkynyl group, an aryl group, a heterocyclic group (any substitution position), an acyl group, an alkoxycarbonyl group, an aryloxycarbonyl group, a heterocyclooxycarbonyl group, a carbamoyl group, an N-hydroxycarbamoyl group, an N-acylcarbamoyl group, an N-sulfonylcarbamoyl group, an N-carbamoylcarbamoyl group, a thiocarbamoyl group, an N-sulfamoylcarbamoyl group, a carbazoyl group, an oxalyl group, an oxamoyl group, a cyano group, a carbonimidoyl group, a formyl group, a hydroxy group, an alkoxy group (including a group containing repeating ethyleneoxy group units or propyleneoxy group units), an aryloxy group, a heterocyclooxy group, an acyloxy group, an (alkoxy or aryloxy) carbonyloxy group, an (unsubstituted, mono-substituted, or di-substituted) carbamoyloxy group, an (unsubstituted, alkyl or aryl) sulfonyloxy group, an amino group, an (alkyl, aryl, or heterocyclic) amino group, an acylamino group, a sulfonamide group, a ureido group, a thioureido group, an N-hydroxyureido group, an imide group, an (alkoxy or aryloxy) carbonylamino group, a sulfamoylamino group, a semicarbazide group, a thiosemicarbazide group, a hydrazino group, an ammonio group, an oxamoylamino group, an N-(alkyl or aryl) sulfonylureido group, an N-acylureido group, an N-acylsulfamoylamino group, a hydroxyamino group, a nitro group, a quaternary nitrogen atom-containing heterocyclic group (e.g. a pyridinio group, an imidazolio group, a quinolirfio group, an isoquinolinio group), an isocyano group, an imino group, a mercapto group, an (alkyl, aryl, or heterocyclic) thio group, an (alkyl, aryl, or heterocyclic) dithio group, an (alkyl or aryl) sulfonyl group, an (alkyl or aryl) sulfinyl group, a sulfo group or a salt thereof, a sulfamoyl group, an N-acylsulfamoyl group, an N-sulfonylsulfamoyl group or a salt thereof, a phosphino group, a phosphinyl group, a phosphinyloxy group, a phosphinylamino group, and a silyl group.

More preferred examples thereof include a halogen atom (a fluorine atom, a chlorine atom, a bromine atom, or an iodine atom), an alkyl group (which may be a straight-chain, branched, or cyclic alkyl group or a polycyclic alkyl group such as a bicycloalkyl group, and may contain an active methine group), an alkenyl group, an alkynyl group, an aryl group, an amino group, and a heterocyclic group (any substitution position).

With regard to the ring formed by $R^1$ and $R^2$ in Formula (I) bonding to each other and the —C—N— bond, it may be monocyclic or polycyclic, and is preferably a five to six-membered monocycle or a polycycle formed from five to six-membered rings.

The monovalent substituent may be further substituted with the above-mentioned monovalent substituent. The monovalent substituent may form a ring if this is possible.

The compound represented by Formula (I) that can be used in the present invention may be a compound in the form of a hydrochloride or carboxylate salt.

The compound represented by Formula (I) preferably has a molecular weight of 70 to 600, and more preferably 70 to 400.

Specific examples of the compound represented by Formula (I) are listed below, but the compound should not be construed as being limited thereto.
I-1
I-2
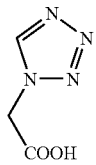
I-3
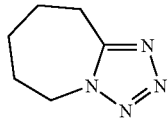
I-4
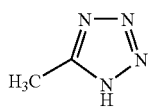
I-5
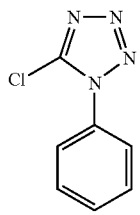
I-6
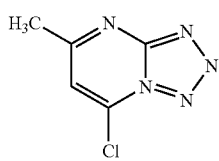
I-7
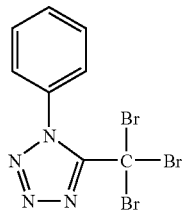
I-8
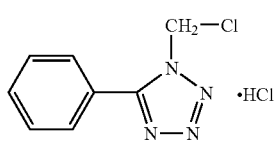
I-9
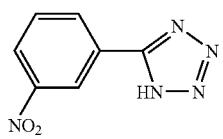
-continued
I-10
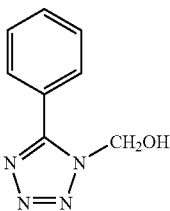
I-11
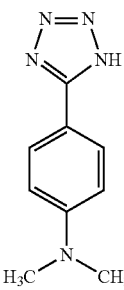
I-12
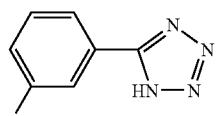
I-13
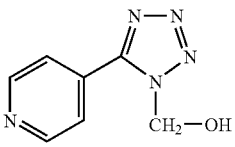
I-14
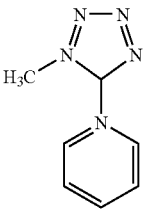
I-15
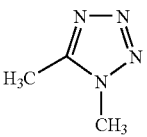
I-16
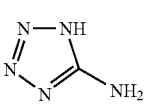
I-17
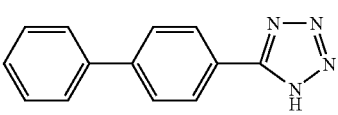
I-18
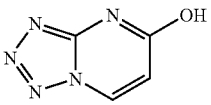

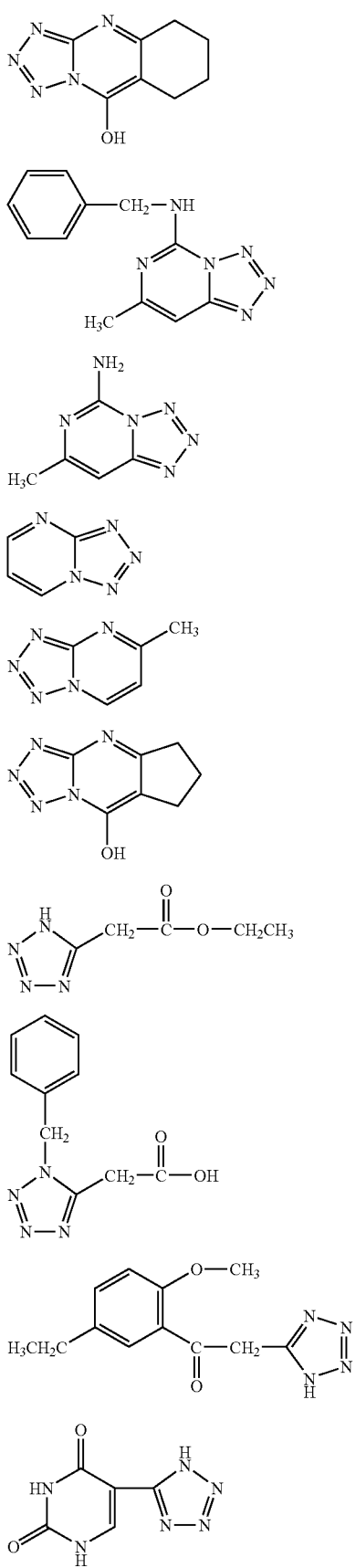
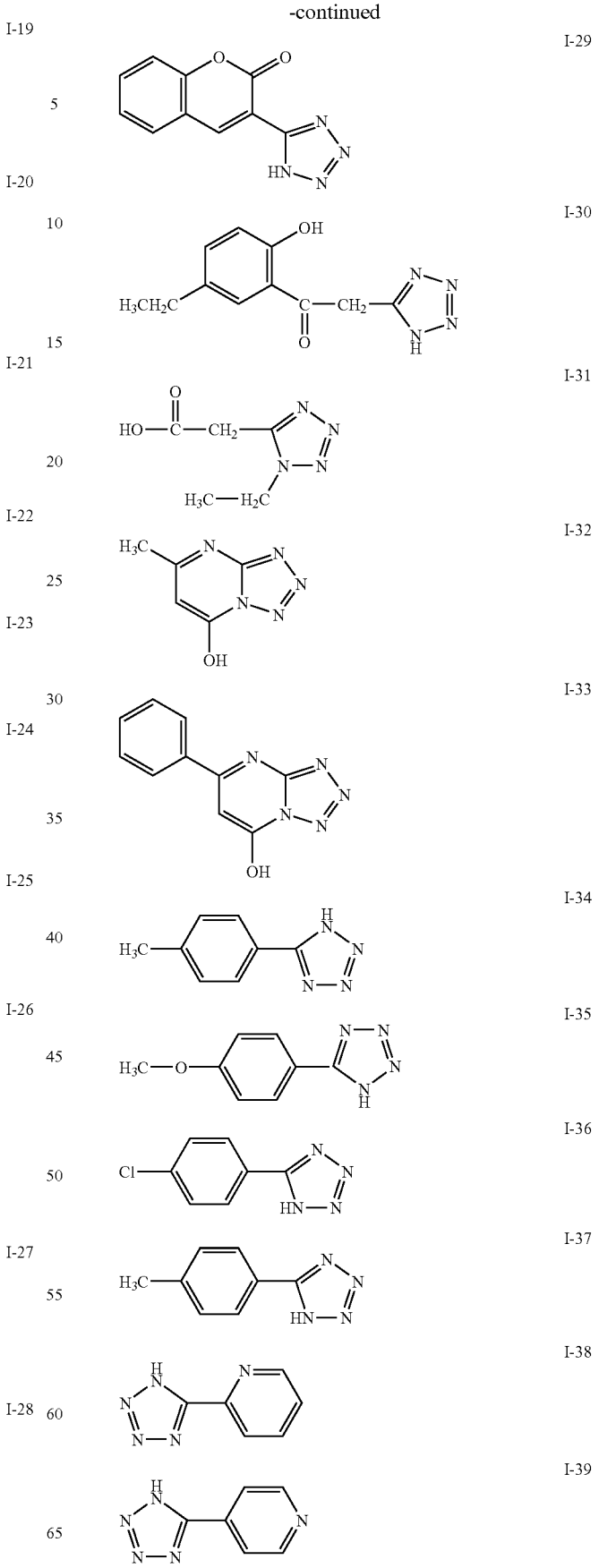

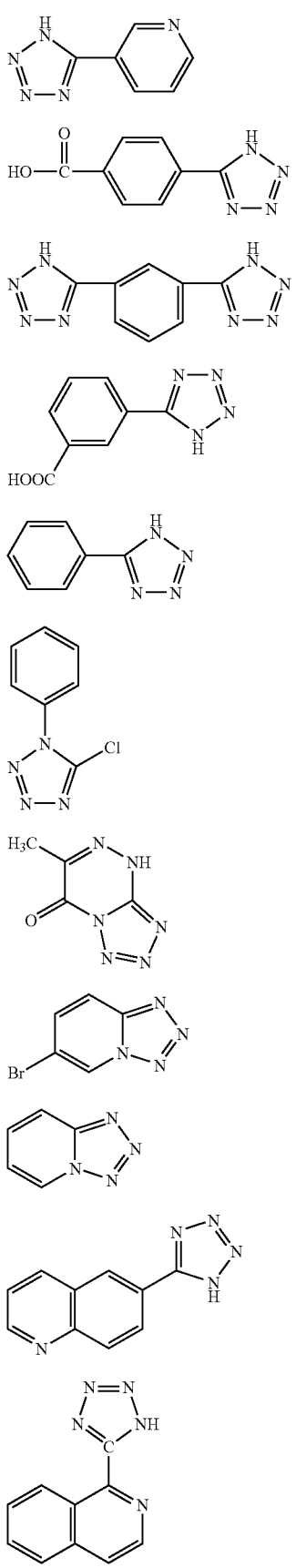

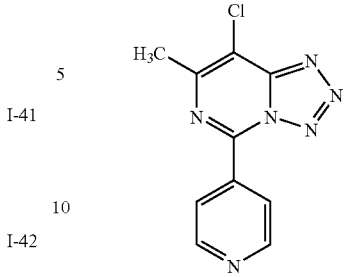

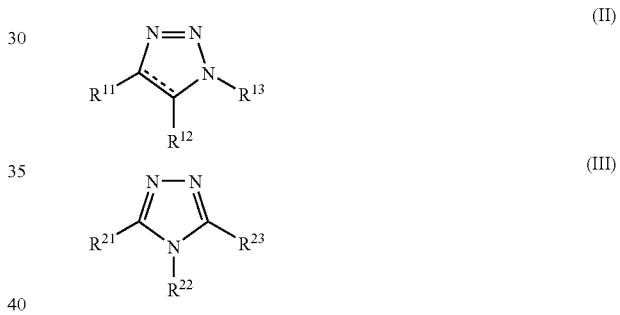

Among the compounds represented by Formula (1), Compounds I-1, I-3, I-4, I-10, I-15, I-16, I-21, I-22, I-23, I-41, and I-48 are preferable, Compounds I-1, I-4, I-15, I-16, I-22, and I-23 are more preferable, and Compounds I-1, I-4, and I-16 are yet more preferable.

The compounds represented by Formula (I) may be used singly or in a combination of two or more types.

The compounds represented by Formula (I) may be synthesized in accordance with a standard method, or a commercial product may be used.

Triazole compounds represented by Formula (II) and Formula (III) are now explained below.

In Formula (II) and Formula (III), $R^{11}$ to $R^{13}$ and $R^{21}$ to $R^{23}$ independently denote a hydrogen atom or a monovalent substituent. Any two selected from $R^{11}$ to $R^{13}$ or $R^{21}$ to $R^{23}$ may bond to each other to form a ring. In the present invention, $R^{11}$ and $R^{12}$ are not fused together to form a hydrocarbon ring. The hydrocarbon ring referred to here includes an aliphatic hydrocarbon ring and an aromatic hydrocarbon ring. The dotted line in Formula (II) denotes that the compound represented by Formula (II) may be either a 1,2,3-triazole derivative or a 4,5-dihydro-1,2,3-triazole derivative, and among them it is preferable for the compound represented by Formula (II) to be a 1,2,3-triazole derivative.

Examples of $R^{11}$ to $R^{13}$ and $R^{21}$ to $R^{23}$ include the same monovalent substituents as those cited for $R^1$ and $R^2$ in Formula (I) above. In $R^{13}$ and $R^{22}$ among the above-mentioned monovalent substituents, a monovalent substituent that cannot give a stable compound when bonded to the nitrogen atom is excluded.

The above-mentioned monovalent substituent may be further substituted with the above-mentioned monovalent substituent. Furthermore, the above-mentioned monovalent substituent may form a ring if this is possible.

Among these, preferred examples of the monovalent substituent include an alkyl group, an amino group, an imide group, a carboxy group or a salt thereof, a hydroxy group, a carbamoyl group, a sulfo group or a salt thereof, and a sulfamoyl group, and an alkyl group and an amino group are more preferable.

The compounds represented by Formula (II) and Formula (III) preferably have a molecular weight of 69 to 600, and more preferably 69 to 400.

Preferred specific examples of the compounds represented by Formula (II) and Formula (III) are listed below, but they should not be construed as being limited thereto.

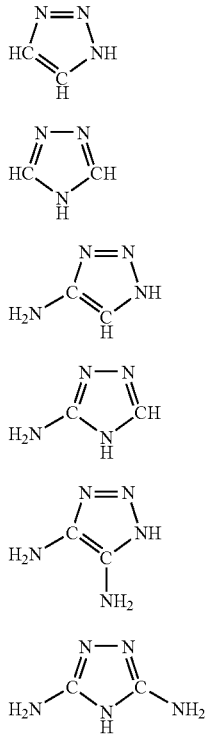

The compounds represented by Formula (II) and Formula (III) may be synthesized in accordance with a standard method, or a commercial product may be used.

Compound A may be used singly or in a combination of two or more types.

The amount of Compound A added is, as a total amount, preferably less than 300 mg in 1 L of a polishing liquid when used for polishing (that is, a diluted polishing liquid when it is diluted with water or an aqueous solution, a 'polishing liquid when used for polishing' described later having the same meaning), more preferably at least 0.01 mg but less than 300 mg, yet more preferably 10 to 200 mg, and particularly preferably 20 to 100 mg.

It is preferable if the amount of Compound A added is in the above-mentioned range since a polishing performance with high polishing rate and low dishing can be obtained.

Compound B

The polishing liquid of the present invention comprises a compound having an imidazole skeleton or an isothiazolin-3-one skeleton (Compound B).

Compound B can be used without any restriction as long as it is a compound having an imidazole skeleton or an isothiazolin-3-one skeleton, but among these it is preferable for it to be an imidazole derivative, a benzoimidazole derivative, an isothiazolin-3-one derivative, or 1,2-benzoisothiazolin-3-one derivative.

It is also preferable for Compound B to be a compound containing no halogen atom.

Specifically, compounds having Formulae (IV) to (VII) below can be cited as preferred examples.

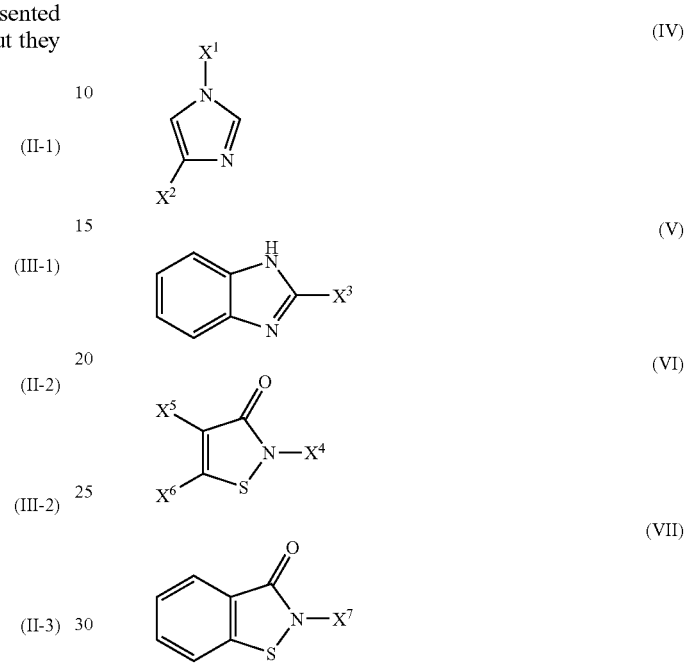

As $X^1$ to $X^7$, a hydrogen atom and a monovalent substituent can be cited in the same way as for $R^1$ and $R^2$ in Formula (I) above. As the substituent, the same groups as for $R^1$ can be selected, except that with regard to $X^1$, $X^4$ and $X^7$, among the above-mentioned monovalent substituents a monovalent substituent that cannot give a stable compound when bonded to the nitrogen atom is excluded.

The above-mentioned monovalent substituent may be substituted with the above-mentioned monovalent substituent. The above-mentioned monovalent substituent may form a ring if this is possible.

Specific preferred examples of the compounds represented by Formulae (IV) to (VII) are listed below, but they should not be construed as being limited thereto.

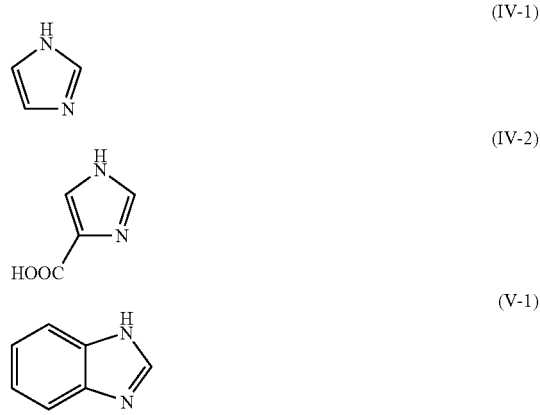

-continued

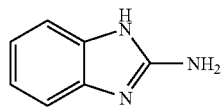
(V-2)

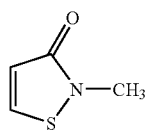
(VI-1)

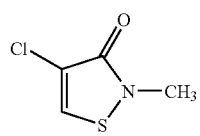
(VI-2)

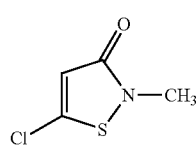
(VI-3)

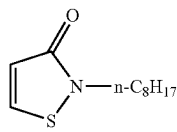
(VI-4)

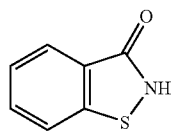
(VII-1)

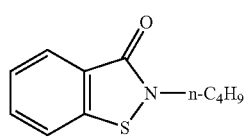
(VII-2)

Among Compounds (VI-1) to (VII-2), Compound B is preferably (IV-1), (IV-2), (V-1), (V-2), (VI-1), (VI-4), (VII-1), or (VII-2), and particularly preferably (IV-1), (V-1), or (VI-1).

Compound B preferably has a molecular weight of 68 to 600, and more preferably 68 to 400.

Furthermore, Compound B may be used singly or in a combination of two or more types.

The amount of Compound B added is, as a total amount, preferably at least 10 mg but less than 500 mg in 1 L of a polishing liquid when used for polishing, more preferably 10 to 300 mg, and yet more preferably 10 to 100 mg.

It is preferable if the amount of Compound B added is in the above-mentioned range since a polishing performance with high polishing rate and low dishing can be obtained.

It is also preferable to use Compound A and Compound B in combination since a composite non-conducting film is formed during polishing.

Solvent

In the present invention, the polishing liquid is an aqueous polishing liquid.

In the present invention, 'aqueous' means that the water content of a solvent is at least 50%, preferably at least 75%, more preferably at least 90%, and yet more preferably at least 95%.

The solvent referred to here means a solvent excluding the above-mentioned Compound A and Compound B and, furthermore, various types of additives such as a chelating agent, an oxidizing agent, and a chelating agent, abrasive grains, etc., which will be described later.

Examples of the solvent that can be used in the present invention include water such as distilled water, ion-exchanged water, and pure water, and a solvent that is compatible with water, such as a water-soluble solvent, may be added to the water.

Examples of the water-soluble solvent include methanol, ethanol, n-propyl alcohol, iso-propyl alcohol, acetonitrile, ethyl acetate, N-methylpyrrolidone, n-butanol, sec-butanol, tert-butanol, n-pentanol, acetone, methyl ethyl ketone, ethylene glycol monomethyl ether, ethylene glycol monoethyl ether, ethylene glycol mono-tert-butyl ether, ethylene glycol mono-n-butyl ether, ethylene glycol monophenyl ether, propylene glycol monomethyl ether, propylene glycol monoethyl ether, propylene glycol mono-tert-butyl ether, propylene glycol mono-n-butyl ether, diethylene glycol monomethyl ether, diethylene glycol monoethyl ether, diethylene glycol mono-tert-butyl ether, diethylene glycol mono-n-butyl ether, dipropylene glycol monomethyl ether, dipropylene glycol monoethyl ether, methyl lactate, ethyl lactate, and γ-butyrolactone.

Oxidizing Agent

The polishing liquid of the present invention comprises a compound (oxidizing agent) that can oxidize a polishing target metal.

Examples of the oxidizing agent include hydrogen peroxide, a peroxide, a nitrate, an iodinate, a periodate, a hypochlorite, a chlorite, a chlorate, a perchlorate, a persulfate, a dichromate, a permanganate, ozone water, a silver (II) salt, and an iron (III) salt.

Preferred examples of the iron (III) salt include inorganic iron (III) salts such as iron (III) nitrate, iron (III) chloride, iron (III) sulfate, and iron (III) bromide, and organic complex salts of iron (III).

When an organic complex salt of iron (III) is used, with regard to complex-forming compounds forming an iron (III) complex salt, examples thereof include acetic acid, citric acid, oxalic acid, salicylic acid, diethyldithiocarbamic acid, succinic acid, tartaric acid, glycolic acid, glycine, alanine, aspartic acid, thioglycolic acid, ethylene diamine, trimethylene diamine, diethylene glycol, triethylene glycol, 1,2-ethanedithiol, malonic acid, glutaric acid, 3-hydroxybutyric acid, propionic acid, phthalic acid, isophthalic acid, 3-hydroxysalicylic acid, 3,5-dihydroxysalicylic acid, gallic acid, benzoic acid, maleic acid, salts thereof, and an aminopolycarboxylic acid and a salt thereof.

Examples of the aminopolycarboxylic acid and the salt thereof include ethylenediamine-N,N,N',N'-tetraacetic acid, diethylenetriaminepentaacetic acid, 1,3-diaminopropane-N,N,N',N'-tetraacetic acid, 1,2-diaminopropane-N,N,N',N'-tetraacetic acid, ethylenediamine-N,N'-disuccinic acid (racemate), ethylenediaminedisuccinic acid (SS form), N-(2-carboxylatoethyl)-L-aspartic acid, N-(carboxymethyl)-L-aspartic acid, β-alaninediacetic acid, methyliminodiacetic acid, nitrilotriacetic acid, cyclohexanediaminetetraacetic acid, iminodiacetic acid, glycol ether diaminetetraacetic acid, ethylenediamine-N,N'-diacetic acid, ethylenediamine-orthohydroxyphenylacetic acid, N,N-bis(2-hydroxybenzyl)ethylenediamine-N,N-diacetic acid, and salts thereof. The type of counter salt is preferably an alkali metal salt or an ammonium salt, and particularly preferably an ammonium salt.

Among them, hydrogen peroxide, an iodate, a hypochlorite, a chlorate, and an organic complex salt of iron (III) are preferable; when an organic complex salt of iron (III) is used, preferred examples of the complex-forming compounds include citric acid, tartaric acid, and an aminopolycarboxylic acid (specifically, ethylenediamine-N,N,N',N'-tetraacetic acid, diethylenetriaminepentaacetic acid, 1,3-diaminopropane-N,N,N',N'-tetraacetic acid, ethylenediamine-N,N'-disuccinic acid (racemate), ethylenediaminedisuccinic acid (SS form), N-(2-carboxylatoethyl)-L-aspartic acid, N-(carboxymethyl)-L-aspartic acid, β-alaninediacetic acid, methyliminodiacetic acid, nitrilotriacetic acid, or iminodiacetic acid).

Among the oxidizing agents, hydrogen peroxide, and ethylenediamine-N,N,N',N'-tetraacetic acid, 1,3-diaminopropane-N,N,N',N'-tetraacetic acid, and ethylenediaminedisuccinic acid (SS form) complexes of iron (III) are most preferable.

The amount of oxidizing agent added is preferably 0.003 mol to 8 mol in 1 L of the polishing liquid when used for polishing, more preferably 0.03 mol to 6 mol, and particularly preferably 0.1 mol to 4 mol. That is, the amount of oxidizing agent added is preferably at least 0.003 mol/L from the viewpoint of oxidation of the metal being adequate and a high CMP rate being guaranteed, and no greater than 8 mol/L from the viewpoint of preventing the polished surface from becoming rough.

Abrasive Grains

The polishing liquid of the present invention preferably comprises abrasive grains. Preferred examples of the abrasive grains include silica (precipitated silica, fumed silica, colloidal silica, synthetic silica), ceria, alumina, titania, zirconia, germania, manganese oxide, silicon carbide, polystyrene, polyacrylic, and polyterephthalate.

The abrasive grains preferably have an average particle size of 5 to 1,000 nm, and particularly preferably 10 to 200 nm.

The amount of abrasive grains added is preferably in the range of 0.01 to 20 wt % relative to the total weight of the polishing liquid when used, and more preferably in the range of 0.05 to 5 wt %. In order to obtain a sufficient effect with respect to the polishing rate, the amount is preferably at least 0.01 wt %, and since the polishing rate of the CMP saturates, the amount is preferably no greater than 20 wt %.

Chelating Agent

The polishing liquid of the present invention preferably comprises a chelating agent.

The chelating agent that can be used in the present invention in order to suppress the adverse influence of contamination by metal ions, and polyvalent metal ions in particular, during preparation of the polishing liquid or during polishing is not particularly limited as long as it is a compound that forms a metal salt compound or a complex salt with the metal ion or a compound that forms a metal complex by coordinating to the metal ion, and preferred examples thereof include polycarboxylic acids such as oxalic acid, malonic acid, succinic acid, glutaric acid, adipic acid, pimelic acid, maleic acid, phthalic acid, malic acid, tartaric acid, and citric acid, polyphosphonic acids such as N,N,N-trimethylenephosphonic acid and 1-hydroxyethylidene-1,1-diphosphonic acid, polysulfonic acids such as 1,2-dihydroxybenzene-4,6-disulfonic acid and ethylenediamine-N,N,N',N'-tetramethylenesulfonic acid, amino acids, and aminopolycarboxylic acids, and water-soluble amino acids and water-soluble aminopolycarboxylic acids are particularly preferable.

The amino acid that can be used in the present invention may have a substituent, and in particular one selected from the group below is suitably used.

Amino acids such as glycine, L-alanine, β-alanine, L-2-aminobutyric acid, L-norvaline, L-valine, L-leucine, L-norleucine, L-isoleucine, L-alloisoleucine, L-phenylalanine, L-proline, sarcosine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cysteine, L-methionine, L-ethionine, L-lanthionine, L-cystathionine, L-cystine, L-cysteinic acid, L-aspartic acid, L-glutamic acid, S-(carboxymethyl)-L-cysteine, 4-aminobutyric acid, L-asparagine, L-glutamine, azaserine, L-arginine, L-canavanine, L-citrulline, δ-hydroxy-L-lysine, creatine, L-kynurenine, L-histidine, 1-methyl-L-histidine, 3-methyl-L-histidine, ergothioneine, L-tryptophan, actinomycin C1, apamin, angiotensin I, angiotensin II, and antipain.

Among them, glycine, L-alanine, L-histidine, L-proline, L-lysine, and dihydroxyethylglycine are particularly preferable.

Examples of the aminopolycarboxylic acid include iminodiacetic acid, nitrilotriacetic acid, diethylenetriaminepentaacetic acid, ethylenediaminetetraacetic acid, trans-cyclohexanediaminetetraacetic acid, 1,2-diaminopropanetetraacetic acid, glycol ether diaminetetraacetic acid, ethylenediamine-ortho-hydroxyphenylacetic acid, ethylenediaminedisuccinic acid (SS form), N-(2-carboxylatoethyl)-L-aspartic acid, β-alaninediacetic acid, 2-phosphonobutane-1,2,4-tricarboxylic acid, and N,N'-bis(2-hydroxybenzyl)ethylenediamine-N,N'-diacetic acid.

The chelating agent that can be used in the present invention is particularly preferably a compound represented by Formula (1) or Formula (2) below.

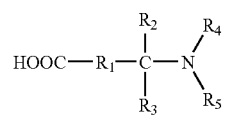

(1)

$R_1$ in Formula (1) denotes a single bond, an alkylene group, or a phenylene group.

$R_2$ and $R_3$ in Formula (1) independently denote a hydrogen atom, a halogen atom, a carboxyl group, an alkyl group, a cycloalkyl group, an alkenyl group, an alkynyl group, or an aryl group.

$R_4$ and $R_5$ in Formula (1) independently denote a hydrogen atom, a halogen atom, a carboxyl group, an alkyl group, or an acyl group.

When $R_1$ is a single bond, at least one of $R_4$ and $R_5$ is not a hydrogen atom.

The alkylene group denoted by $R_1$ in Formula (1) may be any of straight-chain, branched, or cyclic, and preferably has 1 to 8 carbons; examples thereof include a methylene group and an ethylene group.

Examples of a substituent that may be possessed by the above-mentioned alkylene group include a hydroxyl group and a halogen atom.

The alkyl group denoted by $R_2$ and $R_3$ in Formula (1) preferably has 1 to 8 carbons, and examples thereof include a methyl group and a propyl group.

The cycloalkyl group denoted by $R_2$ and $R_3$ in Formula (1) preferably has 5 to 15 carbons, and examples thereof include a cyclopentyl group, a cyclohexyl group, and a cyclooctyl group.

The alkenyl group denoted by $R_2$ and $R_3$ in Formula (1) preferably has 2 to 9 carbons, and examples thereof include a vinyl group, a propenyl group, and an allyl group.

The alkynyl group denoted by $R_2$ and $R_3$ in Formula (1) preferably has 2 to 9 carbons, and examples thereof include an ethynyl group, a propynyl group, and a butynyl group.

The aryl group denoted by $R_2$ and $R_3$ in Formula (1) preferably has 6 to 15 carbons, and examples thereof include a phenyl group.

The alkylene chain in these groups may have a hetero atom such as an oxygen atom or a sulfur atom.

Examples of a substituent that may be possessed by each group denoted by $R_2$ and $R_3$ in Formula (1) include a hydroxyl group, a halogen atom, an aromatic ring (preferably having 3 to 15 carbons), a carboxyl group, and an amino group.

The alkyl group denoted by $R_4$ and $R_5$ in Formula (1) preferably has 1 to 8 carbons, and examples thereof include a methyl group and an ethyl group.

The acyl group preferably has 2 to 9 carbons, and examples thereof include a methylcarbonyl group.

Examples of a substituent that may be possessed by each group denoted by $R_4$ and $R_5$ in Formula (1) include a hydroxyl group, an amino group, and a halogen atom.

In Formula (1), it is preferable that either one of $R_4$ and $R_5$ is not a hydrogen atom.

Furthermore, in Formula (1), it is particularly preferable for $R_1$ to be a single bond and for $R_2$ and $R_4$ to be hydrogen atoms. In this case, $R_3$ denotes a hydrogen atom, a halogen atom, a carboxyl group, an alkyl group, a cycloalkyl group, an alkenyl group, an alkynyl group, or an aryl group, and particularly preferably a hydrogen atom or an alkyl group. $R_5$ denotes a hydrogen atom, a halogen atom, a carboxyl group, an alkyl group, or an acyl group, and particularly preferably an alkyl group. The substituent that may be possessed by the alkyl group denoted by $R_3$ is preferably a hydroxyl group, a carboxyl group, or an amino group. The substituent that may be possessed by the alkyl group denoted by $R_5$ is preferably a hydroxyl group or an amino group.

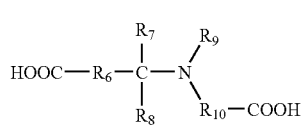

(2)

$R_6$ in Formula (2) denotes a single bond, an alkylene group, or a phenylene group.

$R_7$ and $R_8$ in Formula (2) independently denote a hydrogen atom, a halogen atom, a carboxyl group, an alkyl group, a cycloalkyl group, an alkenyl group, an alkynyl group, or an aryl group.

$R_9$ in Formula (2) denotes a hydrogen atom, a halogen atom, a carboxyl group, or an alkyl group.

$R_{10}$ in Formula (2) denotes an alkylene group.

When $R_{10}$ is —$CH_2$—, at least one of $R_6$ not being a single bond and $R_9$ not being a hydrogen atom is satisfied.

The alkylene group denoted by $R_6$ and $R_{10}$ in Formula (2) may be either straight-chain, branched, or cyclic, and preferably has 1 to 8 carbons, and examples thereof include a methylene group and an ethylene group.

Examples of a substituent that may be possessed by the above-mentioned alkylene group and phenylene group include a hydroxyl group and a halogen atom.

The alkyl group denoted by $R_7$ and $R_8$ in Formula (2) preferably has 1 to 8 carbons, and examples thereof include a methyl group and a propyl group.

The cycloalkyl group denoted by $R_7$ and $R_8$ in Formula (2) preferably has 5 to 15 carbons, and examples thereof include a cyclopentyl group, a cyclohexyl group, and a cyclooctyl group.

The alkenyl group denoted by $R_7$ and $R_8$ in Formula (2) preferably has 2 to 9 carbons, and examples thereof include a vinyl group, a propenyl group, and an allyl group.

The alkynyl group denoted by $R_7$ and $R_8$ in Formula (2) preferably has 2 to 9 carbons, and examples thereof include an ethynyl group, a propynyl group, and a butynyl group.

The aryl group denoted by $R_7$ and $R_8$ in Formula (2) preferably has 6 to 15 carbons, and examples thereof include a phenyl group.

The alkylene chain in these groups may have a hetero atom such as an oxygen atom or a sulfur atom.

Examples of a substituent that may be possessed by each group denoted by $R_7$ and $R_8$ in Formula (2) include a hydroxyl group, a halogen atom, and an aromatic ring (preferably having 3 to 15 carbons).

The alkyl group denoted by $R_9$ in Formula (2) preferably has 1 to 8 carbons, and examples thereof include a methyl group and an ethyl group.

The acyl group denoted by $R_9$ in Formula (2) preferably has 2 to 9 carbons, and examples thereof include a methylcarbonyl group.

The alkylene chain in these groups may have a hetero atom such as an oxygen atom or a sulfur atom.

Examples of a substituent that may be possessed by each group denoted by $R_9$ in Formula (2) include a hydroxyl group, an amino group, a halogen atom, and a carboxyl group.

Furthermore, in Formula (2), it is preferable for $R_9$ not to be a hydrogen atom.

Specific examples of the compound represented by Formula (1) or Formula (2) are listed below, but they should not be construed as being limited thereto.

TABLE 1

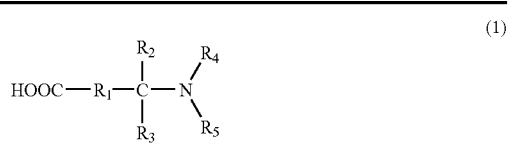

(1)

| | $R_1$ | $R_2$ | $R_3$ | $R_4$ | $R_5$ |
|---|---|---|---|---|---|
| A-1 | — | —H | —H | —H | —$CH_3$ |
| A-2 | — | —H | —H | —H | —$CH_2OH$ |
| A-3 | — | —H | —H | —$CH_2OH$ | —$CH_2OH$ |
| A-4 | — | —H | —H | —H | —$CH_2CH_2OH$ |
| A-5 | — | —H | —H | —$CH_2CH_2OH$ | —$CH_2CH_2OH$ |

TABLE 1-continued

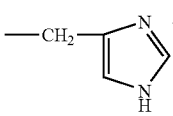

| | $R_1$ | $R_2$ | $R_3$ | $R_4$ | $R_5$ |
|---|---|---|---|---|---|
| A-6 | — | —H | —$CH_3$ | —H | —$CH_2OH$ |
| A-7 | — | —H | —$CH_3$ | —$CH_2CH_2OH$ | —$CH_2CH_2OH$ |
| A-8 | — | —H | —$CH_2OH$ | —H | —$CH_2OH$ |
| A-9 | — | —H | —$CH(CH_3)_2$ | —$CH_2OH$ | —$CH_2OH$ |
| A-10 | — | —H | —Ph | —H | —$(CH_2CH_2O)_2$—H |
| A-11 | — | —H | —$CH_2$-(imidazole) | —$CH_2CH_2OH$ | —$CH_2CH_2OH$ |
| A-12 | — | —H | —$CH_2SCH_3$ | —$CH_2CH_2OH$ | —$CH_2CH_2OH$ |
| A-13 | — | —H | —H | —H | —$COCH_2NH_2$ |
| A-14 | — | —H | —$CH_2OH$ | —H | —$COCH_2NH_2$ |
| A-15 | — | —H | —H | —H | —$COCH_3$ |
| A-16 | —$CH_2$— | —H | —H | —$CH_2CH_2OH$ | —$CH_2CH_2OH$ |
| A-17 | —$CH_2$— | —H | —H | —H | —$CH_2OH$ |
| A-18 | —$CH_2$— | —H | —H | —H | —$COCH_2NH_2$ |
| A-19 | —$CH_2CH_2$— | —H | —H | —H | —H |
| A-20 | — | —H | —$CH_3$ | —H | —$CH_2CH_2OH$ |
| A-21 | — | —H | —$CH_3$ | —H | —$CH_2OH$ |
| A-22 | — | —H | —$CH_2CH_3$ | —H | —$CH_2CH_2OH$ |
| A-23 | — | —H | —$CH_2CH_3$ | —H | —$CH_2OH$ |
| A-24 | — | —H | —$CH_3$ | —H | —$CH_2CH_2NH_2$ |
| A-25 | — | —H | —$CH_2(CH_3)_2$ | —H | —$CH_2CH_2OH$ |
| A-26 | — | —H | —Ph | —H | —$CH_2CH_2OH$ |
| A-27 | — | —H | —H | —H | —$(CH_2)_3OH$ |

TABLE 2

$$HOOC-R_6-\underset{R_8}{\overset{R_7}{C}}-N\underset{R_{10}-COOH}{\overset{R_9}{}} \quad (2)$$

| | $R_6$ | $R_7$ | $R_8$ | $R_9$ | $R_{10}$ |
|---|---|---|---|---|---|
| B-1 | — | —H | —H | —$CH_2$— | —$CH_2$— |
| B-2 | — | —H | —H | —$CH_2OH$ | —$CH_2$— |
| B-3 | — | —H | —H | —$CH_2CH_2OH$ | —$CH_2$— |
| B-4 | — | —H | —H | —$(CH_2CH_2O)_{10}$H | —$CH_2$— |
| B-5 | — | —H | —$CH_3$ | —H | —$CH(CH_3)$— |
| B-6 | — | —H | —$CH_2OH$ | —H | —$CH(CH_2OH)$— |
| B-7 | —$CH_2$— | —H | —H | —H | —$CH_2$— |
| B-8 | —$CH_2$— | —H | —H | —H | —$CH_2CH_2$— |
| B-9 | —$CH_2$— | —H | —H | —$CH_2CH_2OH$ | —$CH_2CH_2$— |
| B-10 | —$CH_2$— | —H | —H | —$CH_2COOH$ | —$CH_2$— |
| B-11 | — | —H | —$CH_3$ | —H | —$CH_2CH_2$ |

A method for synthesizing a compound represented by Formula (1) or (2) is not particularly limited, and a known method may be used. The compound represented by Formula (1) or (2) may employ a commercial product.

The total amount of chelating agent added is preferably 0.0001 to 3 mol in 1 L of the polishing liquid when used for polishing, more preferably 0.005 mol to 1 mol, and particularly preferably 0.01 mol to 0.5 mol.

Moreover, a thiocyanate, a thioether, a thiosulfate, or a mesoionic compound may be further added in an amount that is less than the total amount of chelating compound added.

Preferred examples of the thiocyanate that can be used in the present invention include thiocyanates described in JP-A-2004-235319, preferred examples of the thioether include thioethers described in JP-A-2004-235318, preferred examples of the thiosulfate include thiosulfates described in JP-A-2004-235326, and preferred examples of the mesoionic compound include mesoionic compounds described in JP-A-2004-235320.

Acid

The polishing liquid of the present invention preferably further comprises an acid. The acid referred to here is a compound having a structure that is different from the oxidizing agent that is for oxidizing the metal, and does not include an acid that functions as the above-mentioned oxidizing agent. The acid here has the actions of oxidation promotion, pH adjustment, and buffering.

Examples of the acid include those in the categories of inorganic acids and organic acids.

Examples of the inorganic acid include sulfuric acid, nitric acid, boric acid, and phosphoric acid, and among the inorganic acids phosphoric acid and nitric acid are preferable.

As the organic acid, water-soluble acids are preferable. Those selected from the group below are more suitable. Formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, lactic acid, and salts thereof such as ammonium salts or alkali metal salts, ammonia, ammonium salts, and mixtures thereof can be cited. Among them formic acid, acetic acid, and glycolic acid are preferable.

Additive

The polishing liquid of the present invention may comprise an additive below.

Ammonia;

an alkylamine such as dimethylamine, trimethylamine, triethylamine, or propylenediamine, or an amine such as ethylenediaminetetraacetic acid (EDTA), sodium diethyidithiocarbamate, or chitosan;

an imine such as dithizone, cuproine (2,2'-biquinoline), neocuproine (2,9-dimethyl-1,10-phenanthroline), bathocuproine (2,9-dimethyl-4,7-diphenyl-1,10-phenanthroline), or cuperazone (biscyclohexanone oxalylhydrazone);

an azole such as 2-[2-(benzothiazolyl)]thiopropionic acid, 2-[2-(benzothiazolyl)]thiobutyric acid, 2-mercaptobenzothiazole, benzotriazole, 1-hydroxybenzotriazole, 1-dihydtoxypropylbenzotriazole, 2,3-dicarboxypropylbenzotriazole, 4-hydroxybenzotriazole, 4-carboxyl-1H-benzotriazole, 4-methoxycarbonyl-1H-benzotriazole, 4-butoxycarbonyl-1H-benzotriazole, 4-octyloxycarbonyl-1H-benzotriazole, 5-hexylbenzotriazole, N-(1,2,3-benzotriazolyl-1-methyl)-N-(1,2,4-triazolyl-1-methyl)-2-ethylhexylamine, tolyltriazole, naphthotriazole, or bis[(1-benzotriazolyl)methyl]phosphonic acid;

a mercaptan such as nonylmercaptan, dodecylmercaptan, triazinethiol, triazinedithiol, or triazinetrithiol, and others such as tetrazole or quinaldic acid.

Among them chitosan, ethylenediaminetetraacetic acid, cuperazone, triazinedithiol, benzotriazole, 4-hydroxybenzotriazole, 4-butoxycarbonyl-1H-benzotriazole, tolyltriazole, and naphthotriazole are preferable from the viewpoint of achieving a balance between a high CMP rate and a low etching rate.

The amount of additive added is. preferably 0.0001 mol to 0.5 mol in 1 L of the polishing liquid when used for polishing, more preferably 0.001 mol to 0.2 mol, and particularly preferably 0.005 mol to 0.1 mol. That is, the amount of additive added is preferably at least 0.0001 mol/L from the viewpoint of etching being suppressed, and no greater than 0.5 mol/L from the viewpoint of preventing the CMP rate from being degraded.

Surfactant and/or Hydrophilic Polymer

The polishing liquid of the present invention preferably comprises a surfactant and/or a hydrophilic polymer.

The surfactant and the hydrophilic polymer both have a function of decreasing the contact angle of the surface to be polished and a function of promoting uniform polishing. The surfactant and/or the hydrophilic polymer used here are preferably selected from the group below.

Examples of anionic surfactants include a carboxylate salt, a sulfonate salt, a sulfate ester, and a phosphate ester; examples of the carboxylate salt include a soap, an N-acylamino acid salt, a polyoxyethylene or polyoxypropylene alkyl ether carboxylate, and an acylated peptide; examples of the sulfonate salt include an alkylsulfonate salt, an alkylbenzene or alkylnaphthalene sulfonate salt, a naphthalenesulfonate salt, a sulfosuccinate salt, an α-olefinsulfonate salt, and an N-acylsulfonate salt; examples of the sulfate ester include a sulfated oil, an alkylsulfate salt, an alkyl ether sulfate salt, a polyoxyethylene or polyoxypropylene alkyl aryl ether sulfate salt, and an alkylamide sulfate salt; and examples of the phosphate ester include an alkyl phosphate, and a polyoxyethylene or polyoxypropylene alkyl aryl ether phosphate.

Examples of cationic surfactants include an aliphatic amine salt, an aliphatic quaternary ammonium salt, a benzalkonium chloride salt, benzethonium chloride, a pyridinium salt, and an imidazolinium salt; and examples of amphoteric surfactants include a carboxybetaine type, an aminocarboxylate, an imidazolinium betaine, lecithin, and an alkylamine oxide.

Examples of nonionic surfactants include an ether type, an ether ester type, an ester type, and a nitrogen-containing type; specific examples of the ether type include polyoxyethylene alkyl and alkylphenyl ethers, an alkyl aryl formaldehyde condensed polyoxyethylene ether, a polyoxyethylene polyoxypropylene block polymer, and a polyoxyethylene polyoxypropylene alkyl ether, specific examples of the ether ester type include a polyoxyethylene ether of a glycerol ester, a polyoxyethylene ether of a sorbitan ester, and a polyoxyethylene ether of a sorbitol ester, specific examples of the ester type include a polyethylene glycol fatty acid ester, a glycerol ester, a polyglycerol ester, a sorbitan ester, a propylene glycol ester, and a sucrose ester, and specific examples of the nitrogen-containing type include a fatty acid alkanol amide, a polyoxyethylene fatty acid amide, and a polyoxyethylene alkyl amide.

Fluorine-based surfactants, etc. can also be cited as examples.

Furthermore, examples of other surfactants, hydrophilic compounds, hydrophilic polymers, etc. include esters such as a glycerol ester, a sorbitan ester, methoxyacetic acid, ethoxyacetic acid, 3-ethoxypropionic acid, and an alanine ethyl ester; ethers such as polyethylene glycol, polypropylene glycol, polytetramethylene glycol, a polyethylene glycol alkyl ether, a polyethylene glycol alkenyl ether, an alkyl polyethylene glycol, an alkyl polyethylene glycol alkyl ether, an alkyl polyethylene glycol alkenyl ether, an alkenyl polyethylene glycol, an alkenyl polyethylene glycol alkyl ether, an alkenyl polyethylene glycol alkenyl ether, a polypropylene glycol alkyl ether, a polypropylene glycol alkenyl ether, an alkyl polypropylene glycol, an alkyl polypropylene glycol alkyl ether, an alkyl polypropylene glycol alkenyl ether, an alkenyl polypropylene glycol, an alkenyl polypropylene glycol alkyl ether, and an alkenyl polypropylene glycol alkenyl ether; polysaccharides such as alginic acid, pectic acid, carboxymethylcellulose, curdlan, and pullulan; amino acid salts such as glycine ammonium salt and glycine sodium salt; polycarboxylic acids and salts thereof such as polyaspartic acid, polyglutamic acid, polylysine, polymalic acid, polymethacrylic acid, ammonium polymethacrylate, sodium polymethacrylate, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, polyamide acid, ammonium polyamide, sodium polyamide, and polyglyoxylate; vinyl-based polymers such as polyvinyl alcohol, polyvinylpyrrolidone, and polyacrolein; ammonium methyltaurinate, sodium methyltaurinate, sodium methyl sulfate, ammonium ethyl sulfate, ammonium butyl sulfate, sulfonic acids and salts thereof such as sodium vinylsulfonate, sodium 1-allylsulfonate, sodium 2-allylsulfonate, sodium methoxymethylsulfonate, sodium ethoxymethylsulfonate, sodium 3-ethoxypropylsulfonate, ammonium methoxymethylsulfonate, ammonium ethoxymethylsulfonate, sodium 3-ethoxypropylsulfonate, and sodium sulfosuccinate; and amides such as propionamide, acrylamide, methylurea, nicotinamide, succinamide, and sulfanylamide.

When a substrate to which the present invention is applied is a semiconductor integrated circuit silicon substrate, etc., since contamination by an alkali metal, an alkaline earth metal, a halide, etc. is undesirable, an acid or an ammonium salt thereof is desirable. When the substrate is a glass substrate, etc., this does not apply. Among the above-mentioned compound examples, ammonium polyacrylate, polyvinyl alcohol, a succinamide, polyvinylpyrrolidone, polyethylene glycol, and a polyoxyethylene polyoxypropylene block polymer are more preferable.

The amount of surfactant and/or hydrophilic polymer added is preferably 0.001 to 10 g in 1 L of the polishing liquid when used for polishing, more preferably 0.01 to 5 g, and particularly preferably 0.1 to 3 g. That is, the amount of surfactant and/or hydrophilic polymer added is preferably at least 0.001 g/L from the viewpoint of a sufficient effect being exhibited, and no greater than 10 g/L from the viewpoint of preventing the CMP rate from being decreased.

Furthermore, the surfactant and/or the hydrophilic polymer preferably have a weight-average molecular weight of 500 to 100,000, and particularly preferably 2,000 to 50,000.

Alkali Agent and Buffering Agent

The polishing liquid of the present invention may comprise as necessary an alkali agent for adjustment of the pH, and a buffering agent from the viewpoint of suppressing variation in the pH.

Examples of the alkali agent and buffering agent include non-metallic alkali agents such as ammonium hydroxide, organic ammonium hydroxides such as tetramethylammonium hydroxide, alkanol amines such as diethanolamine, triethanolamine, and triisopropanolamine, alkali metal hydroxides such as sodium hydroxide, potassium hydroxide, and lithium hydroxide, a carbonate salt, a phosphate salt, a borate salt, a tetraborate salt, a hydroxybenzoate salt, a glycine salt, an N,N-dimethylglycine salt, a leucine salt, a norleucine salt, a guanine salt, a 3,4-dihydroxyphenylalanine salt, an alanine salt, an aminobutyrate salt, a 2-amino-2-methyl-1,3-propanediol salt, a valine salt, a proline salt, a trishydroxyaminomethane salt, and a lysine salt.

Specific examples of the alkali agent and the buffering agent include sodium hydroxide, potassium hydroxide, lithium hydroxide, sodium carbonate, potassium carbonate, sodium bicarbonate, potassium bicarbonate, trisodium phosphate, tripotassium phosphate, disodium phosphate, dipotassium phosphate, sodium borate, potassium borate, sodium tetraborate (borax), potassium tetraborate, sodium o-hydroxybenzoate (sodium salicylate), potassium o-hydroxybenzoate, sodium 5-sulfo-2-hydroxybenzoate (sodium 5-sulfosalicylate), potassium 5-sulfo-2-hydroxybenzoate (potassium 5-sulfosalicylate), ammonium hydroxide, and tetramethylammonium hydroxide.

Among them, particularly preferred alkali agents are ammonium hydroxide, potassium hydroxide, lithium hydroxide, and tetramethylammonium hydroxide.

The amount of alkali agent and buffering agent added may be any amount as long as the pH is maintained in a preferred range, and it is preferably 0.0001 mol to 1.0 mol in 1 L of the polishing liquid when used for polishing, and more preferably 0.003 mol to 0.5 mol.

The polishing liquid of the present invention preferably has a pH of 2 to 8, more preferably a pH of 3 to 8, yet more preferably a pH of 4 to 8, and particularly preferably a pH of 4 to 7. In this range, the polishing liquid of the present invention exhibits particularly superior effects.

In the present invention, it is preferable to appropriately select the type of compound, the amount thereof added, and the pH according to adsorption properties and reactivity toward the polishing surface, the solubility of a subject to be polished, electrochemical properties of the surface to be polished, the state in which a compound functional group is dissociated, and the stability as a liquid.

<Chemical Mechanical Polishing Method>

The chemical mechanical polishing method (hereinafter, also called 'CMP method' or 'polishing method') of the present invention comprises a step of polishing by making a surface to be polished and a polishing surface move relative to each other while being in contact with each other in the presence of the aqueous polishing liquid of the present invention (hereinafter, also called the 'polishing step').

The chemical mechanical polishing method of the present invention has an excellent polishing rate in CMP and suppresses dishing by employing the aqueous polishing liquid of the present invention comprising a five-membered monocyclic compound having at least three nitrogen atoms or a compound in which a hetero ring is fused to said compound (Compound A), and a compound having an imidazole skeleton or an isothiazolin-3-one skeleton (Compound B).

Wiring Starting Material

In the present invention, the target for polishing is, for example, wiring on a semiconductor such as an LSI, preferably metal wiring, more preferably wiring formed from copper metal and/or a copper alloy, and particularly preferably wiring formed from a copper alloy. Furthermore, among copper alloys a copper alloy containing silver is preferable. The silver content of the copper alloy is preferably no greater than 40 wt %, particularly preferably no greater than 10 wt %, and more preferably no greater than 1 wt %, and the best effects can be exhibited when the content thereof in the copper alloy is in the range of 0.00001 to 0.1 wt %. As described above, the aqueous polishing liquid of the present invention is a polishing liquid that can suitably be used for polishing of metal, carbon, precious metal, etc. wiring in a semiconductor such as an LSI and, needless to say, accompanying polishing of the wire, the polishing liquid may partially polish a silicon substrate, silicon oxide, silicon nitride, a resin, etc. due to the effect of the acid or the abrasive grains, etc.

Thickness of Wiring

In the present invention, for example, the semiconductor that is a polishing target is preferably an LSI having wiring with a half-pitch of 0.15 μm less for a DRAM device, more preferably 0.10 μm or less, and yet more preferably 0.08 μm or less. In the case of an MPU device, it is preferably an LSI having wiring of 0.12 μm or less, more preferably 0.09 μm or less, and yet more preferably 0.07 μm or less.

The polishing liquid of the present invention exhibits particularly superior effects toward these LSIs.

Average Relative Speed

In the present invention, the average relative velocity of movement (average relative speed) between a polishing surface of a polishing pad and a surface to be polished is defined as the average value of the relative velocity of movement in the radial direction of a straight line passing through the center of the surface to be polished.

For example, when both the surface to be polished and the polishing surface are rotating bodies, the distance between the centers of rotation of the two is defined as the center-to-center distance L. The average relative speed is determined by obtaining the relative velocity of movement of the surface to be polished on the line connecting the centers.

FIG. 1 is a plan view of a rotary type polishing surface including a polishing surface and a surface to be polished for explaining the average relative speed.

In FIG. 1, the distance between a center B of the surface to be polished and a center O of the polishing surface is L (m), the radius of the polishing surface is Rp (m), the radius of the surface to be polished is Rw (m), the angular velocity of the polishing surface is ωp (rad/s), and the angular velocity of the surface to be polished is ωw (rad/s). When Rp>Rw, relative velocities of movement Va, Vb, and Vc at points A, B, and C are given by the equations below.

$$Va=(L-Rw)\times\omega p+Rw\times\omega w \quad \text{A:}$$

$$Vb=L\times\omega p \quad \text{B:}$$

$$Vc=(L+Rw)\times\omega p-Rw\times\omega w \quad \text{C:}$$

The velocity distribution in the radial direction A-C of the surface to be polished is determined by the above-mentioned procedure, and the sum of the velocity distribution values is divided by the number of measurement points to give an average value, which is defined as the average relative velocity of movement.

In the present invention, it is preferable for the average relative speed to be 0.5 to 5.0 m/s, more preferably 1.0 to 3.5 m/s, and particularly preferably 1.5 to 3.0 m/s.

Contact Pressure

In the present invention, a contact pressure is defined as a value obtained by dividing the force acting on a contact section between the polishing surface and the surface to be polished by the contact area of the contact section. For example, when the entire surface of a surface to be polished having a diameter of 200 mm is pressed against a polishing surface having a diameter of 600 mm with a force of 400 N, the contact area is $(0.1)^2\pi=3.14\cdot 10^{-2}$ m², and the contact pressure is $400/(3.14\cdot 10^{-2})=12,732$ Pa.

The contact pressure employed in the CMP method of the present invention is preferably 1,000 to 25,000 Pa, more preferably 2,000 to 17,500 Pa, and yet more preferably 3,500 to 17,000 Pa.

Polishing Equipment

The equipment that can employ the polishing liquid of the present invention is not particularly limited, and preferred examples thereof include Mirra Mesa CMP and Reflexion CMP (manufactured by Applied Materials, Inc.), FREX200 and FREX300 (manufactured by Ebara Corporation), NPS3301 and NPS2301 (manufactured by Nikon Corporation), A-FP-310A and A-FP-210A (manufactured by Tokyo Seimitsu Co., Ltd.), 2300TERES (manufactured by Lam Research Co., Ltd.), and Momentum (manufactured by SpeedFam-IPEC Inc.).

Polishing Conditions and Others

The CMP method of the present invention is further explained.

In the polishing step of the present invention, it is preferable to continuously supply the polishing liquid to the polishing pad by means of a pump, etc. while polishing. This supply amount is not limited, but it is preferable for the surface of the polishing pad to be always covered with the polishing liquid. It is preferable for the semiconductor substrate after completion of polishing to be washed well with running water and then dried after spinning off water droplets attached to the semiconductor substrate by means of a spin dryer, etc.

In the polishing method of the present invention, an aqueous solution for dilution is the same as an aqueous solution described below.

The aqueous solution is water containing in advance at least one of a metal-oxidizing agent, a metal oxide-solubilizing agent, a protective film-forming agent, and a surfactant, and it is arranged so that the total components contained in the aqueous solution and components of the polishing liquid to be diluted are the components for polishing using the polishing liquid. When used by diluting with an aqueous solution, a component that is difficult to dissolve may be added in the form of an aqueous solution, and the polishing liquid can be made concentrated.

As a method for diluting the concentrated polishing liquid by the addition of water or an aqueous solution, there is, for example, a method in which a pipe for supplying the concentrated polishing liquid and a pipe for supplying water or an aqueous solution are combined partway along for mixing, and the mixed diluted polishing liquid is supplied to a polishing pad. Mixing may be carried out by employing a standard method such as, for example, a method in which liquids are made to collide with each other through a narrow passage in a pressurized state, a method in which the pipe is packed with a packing such as glass tubes and the flow of liquid is repeatedly divided, separated, and combined, or a method in which a blade that is rotated by a motor is provided in the pipe.

The supply rate for the polishing liquid is preferably 10 to 1,000 mL/min, and more preferably 50 to 500 mL/min.

As a method for polishing by diluting the concentrated polishing liquid by the addition of water or an aqueous solution, for example, a method can be used in which a pipe for supplying the polishing liquid and a pipe for supplying water or an aqueous solution are provided independently, a predetermined amount of liquid is supplied to a polishing pad from each pipe, and mixing is carried out by relative movement between the polishing pad and a surface to be polished. As another method for diluting the concentrated polishing liquid, there is a method in which predetermined amounts of concentrated polishing liquid and water or an aqueous solution are added to one container, and this mixed polishing liquid is supplied to a polishing pad.

Another polishing method of the present invention is a method in which the constituents that are to be contained in the polishing liquid are divided into at least two groups of constituents, when they are used they are diluted by the addition of water or an aqueous solution and supplied to a polishing pad on a polishing platen so as to contact a surface to be polished, and polishing is carried out by relative movement between the surface to be polished and the polishing pad. For example, Constituent (A) comprises a metal-oxidizing agent, Constituent (B) comprises an acid, an additive, a surfactant, and water, and when used Constituent (A) and Constituent (B) are diluted with water or an aqueous solution.

Alternatively, the additive components that have low solubility are divided into two, that is, Constituents (A) and (B), Constituent (A) comprises an oxidizing agent, an additive, and a surfactant, and Constituent (B) comprises an acid, an additive, a surfactant, and water, and when used Constituent (A) and Constituent (B) are diluted with water or an aqueous solution. In the case of this example, it is necessary to employ three pipes for supplying Constituent (A), Constituent (B), and water or an aqueous solution, and dilution and mixing are carried out by a method in which the three pipes are combined into one pipe for supplying to a polishing pad, and mixing is carried out within the pipe or a method in which two pipes are combined and then combined with the other pipe.

Furthermore, for example, there is a method in which a constituent containing an additive that is difficult to dissolve is mixed with another constituent, the mixing path is made long so as to ensure that there is a long dissolution time, and a pipe for water or an aqueous solution is further combined therewith. With regard to another mixing method, for example, there are a method in which as described above three pipes are directly guided to a polishing pad, and mixing is carried out by relative movement between the polishing pad and a surface to be polished, and a method in which three constituents are mixed in one container, and the diluted polishing liquid is supplied therefrom to a polishing pad. In the above-mentioned polishing methods, one constituent containing a metal-oxidizing agent is maintained at 40° C. or less, the other constituent is heated at a temperature in the range of room temperature to 100° C., and when said one constituent and said other constituent are used by dilution with water or an aqueous solution, the temperature of the mixture is made to be 40° C. or less. This is a preferred method in order to increase the solubility of a starting material having a low solubility in the polishing liquid since the solubility increases when the temperature is high.

A starting material that is dissolved by heating said other component containing no metal-oxidizing agent at a temperature in the range of room temperature to 100° C. precipitates in the solution when the temperature decreases, and when the component whose temperature has decreased is used, it is necessary to heat it in advance so as to dissolve the precipitate. This can be achieved by employing means for feeding a liquid that has a heated and dissolved constituent and means for stirring a liquid containing a precipitate, feeding the liquid, and dissolving by heating the pipe. Since there is a possibility that increasing the temperature of a constituent containing a metal-oxidizing agent to 40° C. or higher might decompose the metal-oxidizing agent, it is preferable to set the temperature at 40° C. or less when mixing the heated constituent and said one constituent containing a metal-oxidizing agent for cooling said heated constituent.

Furthermore, in the present invention, components of the polishing liquid may be divided into two or more and supplied to the polishing surface. In this case, it is preferable to divide them into a component containing an oxide and a component containing an acid. It is also possible to prepare the polishing liquid as a concentrate and supply water for dilution separately to the polishing surface.

Barrier Metal

In the present invention, when the semiconductor employs wiring formed from copper metal and/or a copper alloy, it is preferable to provide a barrier layer between the wiring and an interlayer insulating film in order to prevent copper from diffusing. As the barrier layer, a metal material having a low electrical resistance is preferable, TiN, TiW, Ta, TaN, W, and WN are more preferable, and Ta and TaN are particularly preferable.

As the interlayer insulating film, a thin film of an insulating material having a low permittivity is preferable, and a preferred insulating material is a material having a relative permittivity of 3.0 or less, and preferably a material of 2.8 or less. Specific preferred examples of the low permittivity materials include Black Diamond (manufactured by Applied Materials Inc.), FLARE (manufactured by Honeywell Electronic Materials), SILK (manufactured by The Dow Chemical Company), CORAL (manufactured by Novellus System Inc.), LKD (manufactured by JSR Co., Ltd.), and HSG (manufactured by Hitachi Chemical Co., Ltd.).

Pad

A polishing pad that is used in the present invention may be roughly either a pad with a non-foamed structure or a pad with a foamed structure. The former employs a rigid synthetic resin bulk material such as a plastic board as a pad. The latter is further classified into three types, that is, a closed cell type (dry foam type), an open cell type (wet foam type), and two layer composite type (laminated type), and the two layer composite type (laminated type) is particularly preferable. The foam may be uniform or nonuniform.

Furthermore, the pad may contain abrasive grains (e.g. ceria, silica, alumina, resin, etc.). With regard to the hardness, there are a soft type and a rigid type; either may be used, and it is preferable for each layer of the laminated type to have different hardness. The material thereof is preferably nonwoven fabric, artificial leather, polyamide, polyurethane, polyester, polycarbonate, etc. The surface that is in contact with the polishing surface may be subjected to machining to form grid channels, holes, concentric channels, spiral channels, etc.

Wafer

It is preferable for a wafer that is subjected to CMP using the polishing liquid of the present invention to have a diameter of 200 mm or greater, and particularly preferably 300 mm or greater. The effects of the present invention can be exhibited remarkably when the diameter is 300 mm or greater.

In accordance with the present invention, an aqueous polishing liquid having a high CMP rate and causing little dishing during polishing can be obtained. Furthermore, in accordance with the present invention, a chemical mechanical polishing method that has an excellent polishing rate and causes little dishing can be carried out.

EXAMPLES

The present invention is explained below by reference to examples. However, the present invention should not be construed as being limited to these examples.

Examples 1 to 9 and Comparative Examples 1 to 8

A polishing liquid having the composition below was prepared. With regard to Compound A and Compound B, the compounds shown in Table 3 below were used.

| Preparation of polishing liquid | |
|---|---|
| Colloidal silica (abrasive grains: average particle size 30 nm) | 50 g/L |
| Compound A | described in Table 3 below |
| Compound B | described in Table 3 below |
| Glycine (chelating agent) | 10 g/L |
| 30% hydrogen peroxide (oxidizing agent) | 30 g/L |

The above-mentioned components were added to pure water so as to make the total amount of polishing liquid 1,000 mL. The pH of the polishing liquid was adjusted to 6.8 using aqueous ammonia.

The polishing liquid thus obtained was evaluated in accordance with the evaluation methods for polishing rate and dishing described below.

Method for Evaluating Polishing Rate

Polishing rate was evaluated by polishing a metal film under the conditions below by making a polishing platen of a polishing instrument and a substrate move relative to each other in a state in which the substrate was pressed against a polishing cloth on the polishing platen while supplying slurry to the polishing cloth, and measuring the polishing rate.

Substrate: 6×6 cm silicon wafer equipped with a copper film
Table rotational speed: 50 rpm
Head rotational speed: 50 rpm
Polishing pressure: 168 hPa Polishing pad: product No. IC-1400 manufactured by Rodel Nitta Slurry supply rate: 200 mL/min The polishing rate was calculated by converting electrical resistance values before and after polishing into a film thickness using the equation below.

Polishing rate (nm/min)=(thickness of copper film before polishing−thickness of copper film after polishing)/polishing time Method for Evaluating Dishing With regard to a substrate for dishing evaluation, a silicon oxide film was subjected to patterning by a photolithography step and a reactive ion etching step to form via holes and wiring trenches having a width of 0.09 to 100 μm and a depth of 600 nm, a 20 nm thick Ta film was further formed by a sputtering method, a 50 nm thick copper film was subsequently formed by a sputtering method, a total thickness of 1,000 nm of copper film was then formed by a plating method, and this wafer was cut into a size of 6×6 cm. This substrate was polished under the conditions below while supplying slurry to a polishing cloth on a polishing platen of a polishing instrument, and dishing was determined by measuring a step for a 100 μm/100 μm Line/Space at an over-polish of 30% using a probe type step measuring instrument.

Table rotational speed: 50 rpm
Head rotational speed: 50 rpm
Polishing pressure: 168 hPa
Polishing pad: product No. IC-1400 manufactured by Rodel Nitta
Slurry supply rate: 200 mL/min

What is claimed is:

1. An aqueous polishing liquid comprising:

an oxidizing agent, a five-membered monocyclic compound having at least three nitrogen atoms or a compound in which a hetero ring is fused to said compound; and a compound having an imidazole skeleton or an isothiazolin-3-one skeleton, the five-membered monocyclic compound having at least three nitrogen atoms and/or the compound in which a hetero ring is fused to said compound being used at a total concentration of less than 300 mg/L, and the compound having an imidazole skeleton or an isothiazolin-3-one skeleton being used at a concentration of at least 10 mg/L but no greater than 500 mg/L, wherein the compound having an imidazole skeleton or an isothiazolin-3-one skeleton is a compound having an isothiazolin-3-one skeleton represented by Formula (VI) or Formula (VII),

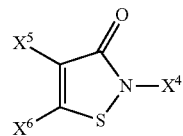

(VI)

TABLE 3

| | Compound A | Compound B | Polishing rate (nm/min) | Dishing (nm) |
|---|---|---|---|---|
| Ex. 1 | 1,2,4-Triazole (50 mg/L) | Imidazole (50 mg/L) | 696.9 | 170.3 |
| Ex. 2 | 1,2,4-Triazole (50 mg/L) | Benzoimidazole (50 mg/L) | 686.0 | 169.5 |
| Ex. 3 | 1,2,4-Triazole (50 mg/L) | 2-Methyl-4-isothiazolin-3-one (50 mg/L) | 692.7 | 154.9 |
| Ex. 4 | 1,2,4-Triazole (50 mg/L) | 2-Methyl-4-isothiazolin-3-one (100 mg/L) | 685.3 | 173.8 |
| Ex. 5 | 1,2,4-Triazole (100 mg/L) | 2-Methyl-4-isothiazolin-3-one (10 mg/L) | 706.3 | 158.0 |
| Ex. 6 | 1,2,3,4-Tetrazole (50 mg/L) | Imidazole (50 mg/L) | 706.4 | 183.3 |
| Ex. 7 | 1,2,3,4-Tetrazole (50 mg/L) | Benzoimidazole (50 mg/L) | 681.0 | 175.6 |
| Ex. 8 | 1,2,3,4-Tetrazole (50 mg/L) | 2-Methyl-4-isothiazolin-3-one (50 mg/L) | 700.4 | 187.9 |
| Ex. 9 | 1,2,3,4-Tetrazole (50 mg/L) | 5-Chloro-2-methyl-4-isothiazolin-3-one (50 mg/L) | 625.1 | 151.8 |
| Comp. Ex. 1 | 1,2,4-Triazole (50 mg/L) | None | 575.8 | 151.1 |
| Comp. Ex. 2 | 1,2,3,4-Tetrazole (50 mg/L) | None | 594.6 | 175.6 |
| Comp. Ex. 3 | None | Imidazole (50 mg/L) | 708.4 | 279.2 |
| Comp. Ex. 4 | None | Benzoimidazole (50 mg/L) | 683.1 | 269.2 |
| Comp. Ex. 5 | None | 2-Methyl-4-isothiazolin-3-one (50 mg/L) | 704.5 | 295.3 |
| Comp. Ex. 6 | 1,2,4-Triazole (300 mg/L) | 2-Methyl-4-isothiazolin-3-one (50 mg/L) | 536.2 | 168.9 |
| Comp. Ex. 7 | 1,2,4-Triazole (50 mg/L) | 2-Methyl-4-isothiazolin-3-one (5 mg/L) | 582.9 | 160.5 |
| Comp. Ex. 8 | 1,2,4-Triazole (50 mg/L) | 2-Methyl-4-isothiazolin-3-one (500 mg/L) | 415.1 | 103.4 |

-continued

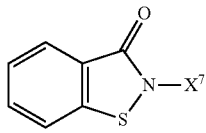
(VII)

wherein $X^4$ to $X^7$ each independently denotes a hydrogen atom or a monovalent substituent.

2. The aqueous polishing liquid according to claim 1, wherein the compound having an imidazole skeleton or an isothiazolin-3-one skeleton is a compound containing no halogen atom.

3. The aqueous polishing liquid according to claim 1, wherein it comprises abrasive grains.

4. The aqueous polishing liquid according to claim 1, wherein the five-membered monocyclic compound having at least three nitrogen atoms or the compound in which a hetero ring is fused to said compound is a compound represented by any one of Formula (I) to Formula (III)

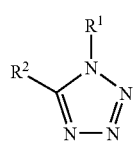
(I)

wherein $R^1$ and $R^2$ independently denote a hydrogen atom or a monovalent substituent, $R^1$ and $R^2$ may bond to each other to form a ring, and when $R^1$ and $R^2$ are simultaneously hydrogen atoms, the compound represented by Formula (I) may be a tautomer thereof,

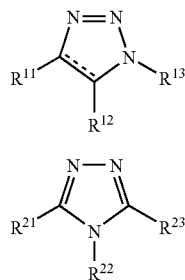
(II)

(III)

wherein $R^{11}$ to $R^{13}$, and $R^{21}$ to $R^{23}$ independently denote a hydrogen atom or a monovalent substituent, any two selected from $R^{11}$ to $R^{13}$ or $R^{21}$ to $R^{23}$ may bond to each other to form a ring, provided that in the present invention $R^{11}$ and $R^{12}$ are not fused to each other to form a hydrocarbon ring, and the dotted line in Formula (II) denotes that the compound represented by Formula (II) may be either a 1,2,3-triazole derivative or a 4,5-dihydro-1,2,3-triazole derivative.

5. The aqueous polishing liquid according to claim 1, wherein the five-membered monocyclic compound having at least three nitrogen atoms or the compound in which a hetero ring is fused to said compound is tetrazole or a derivative thereof.

6. The aqueous polishing liquid according to claim 1, wherein the rate of addition of the five-membered monocyclic compound having at least three nitrogen atoms or the compound in which a hetero ring is fused to said compound is 20 to 100 mg/L at the time of use.

7. The aqueous polishing liquid according to claim 1, wherein the rate of addition of the compound having an imidazole skeleton or an isothiazolin-3-one skeleton is 10 to 100 mg/L at the time of use.

8. The aqueous polishing liquid according to claim 1, wherein the rate of addition of the oxidizing agent is 0.003 to 8 mol/L at the time of use.

9. The aqueous polishing liquid according to claim 1, wherein the pH is 4 to 8.

10. A chemical mechanical polishing method comprising:
a step of polishing by making a surface to be polished and a polishing surface move relative to each other while being in contact with each other in the presence of the aqueous polishing liquid according to claim 1.

11. The aqueous polishing liquid according to claim 1, wherein the compound having an imidazole skeleton or an isothiazolin-3-one skeleton is a compound selected from the group consisting of (VI-2), (VI-3), (VI-4), (VII-1), and (VII-2) below:

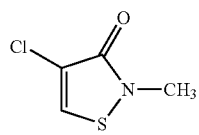
(VI-2)

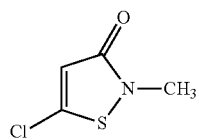
(VI-3)

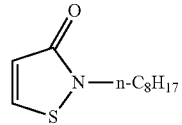
(VI-4)

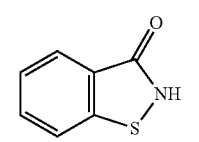
(VII-1)

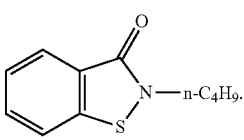
(VII-2)

12. The aqueous polishing liquid according to claim 1, wherein it comprises a chelating agent.

13. The aqueous polishing liquid according to claim 12, wherein the chelating agent is a compound represented by Formula (1) or Formula (2) below,

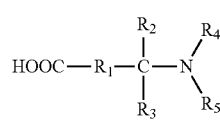
(1)

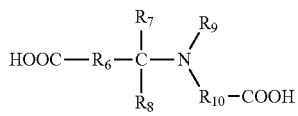

(2)

wherein $R_1$ denotes a single bond, an alkylene group, or a phenylene group, $R_2$ and $R_3$ independently denote a hydrogen atom, a halogen atom, a carboxyl group, an alkyl group, a cycloalkyl group, an alkenyl group, an alkynyl group, or an aryl group, $R_4$ and $R_5$ independently denote a hydrogen atom, a halogen atom, a carboxyl group, an alkyl group, or an acyl group, when $R_1$ is a single bond, at least one of $R_4$ and $R_5$ is not a hydrogen atom, $R_6$ denotes a single bond, an alkylene group, or a phenylene group, $R_7$ and $R_8$ independently denote a hydrogen atom, a halogen atom, a carboxyl group, an alkyl group, a cycloalkyl group, an alkenyl group, an alkynyl group, or an aryl group, $R_9$ denotes a hydrogen atom, a halogen atom, a carboxyl group, or an alkyl group, $R_{10}$ denotes an alkylene group, and when $R_{10}$ is —$CH_2$—, at least one of $R_6$ not being a single bond and $R_9$ not being a hydrogen atom is satisfied.

* * * * *